United States Patent [19]

Raaymakers et al.

[11] Patent Number: 4,999,825
[45] Date of Patent: Mar. 12, 1991

[54] RECORDING/READING APPARATUS FOR INSCRIBABLE RECORD CARRIER AND ITS MANUFACTURE

[75] Inventors: Wilhelmus P. M. Raaymakers; Franciscus L. J. M. Kuijpers, both of Eindhoven, Netherlands

[73] Assignee: U.S. Philips Corporation, New York, N.Y.

[21] Appl. No.: 265,649

[22] Filed: Nov. 1, 1988

[30] Foreign Application Priority Data

Jan. 22, 1988 [NL] Netherlands .................. 8800152

[51] Int. Cl.[5] .............................................. G11B 7/00
[52] U.S. Cl. .................................................. 369/44.26
[58] Field of Search ............................. 369/43–47, 369/59, 32, 275, 276, 28, 44.26; 250/201; 358/342

[56] References Cited

U.S. PATENT DOCUMENTS 4,389,681  6/1983  Tanaka et al. ..................... 360/28 X Primary Examiner—Robert L. Richardson
Attorney, Agent, or Firm—John Francis Moran

[57] ABSTRACT

A record carrier (1) in the form of a disc-shaped carrier provided with a radiation-sensitive layer (6) having a servo track (4). The servo track produces track modulation by having a radial wobble, or lateral periodic deviation whose frequency is modulated with a position-information signal (FIG. 2). Apparatus (FIG. 8) is presented which forms the track pattern during manufacture of the record carrier (1). When an information signal (Vi) is recorded on the record carrier (1) and the recorded signal is read by recording and/or read apparatus (FIG. 4), the position-information signal (FIG. 2) is recovered by an FM demodulator device (60) from variations in the scanning beam (55) which are propduced by the track modulation. Moveover, a clock signal for the purpose of scanning-velocity control is recovered from this variation in the scanning beam. Furthermore, embodiments of the record carrier highly suitable for recording EFM-modulated signals are described.

17 Claims, 6 Drawing Sheets

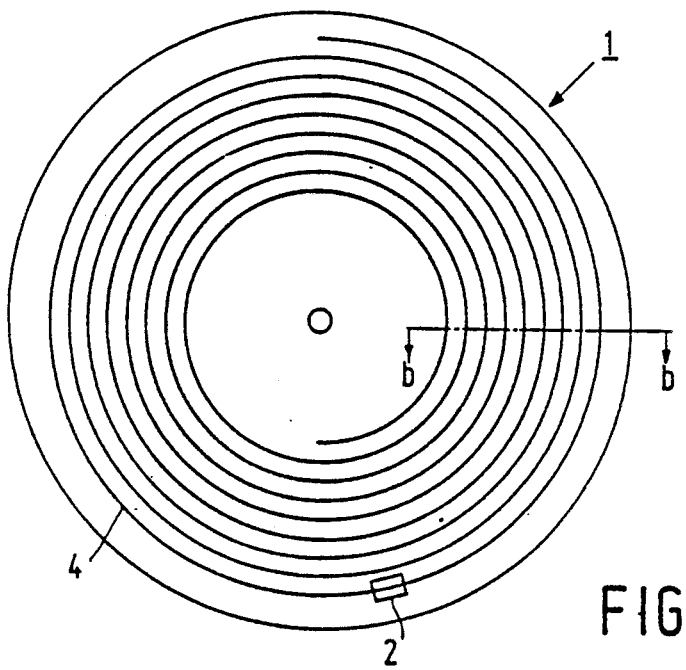
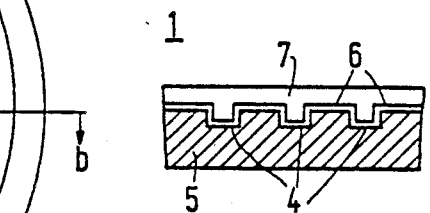
FIG.1a
FIG.1b
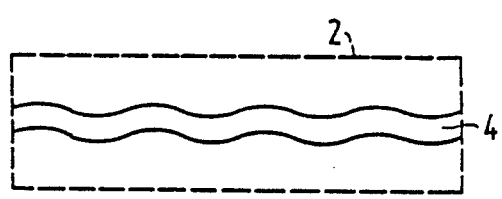
FIG.1c
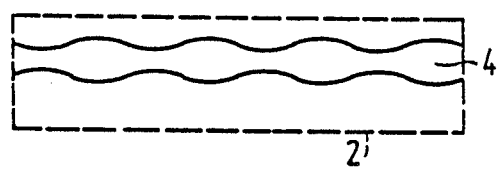
FIG.1d
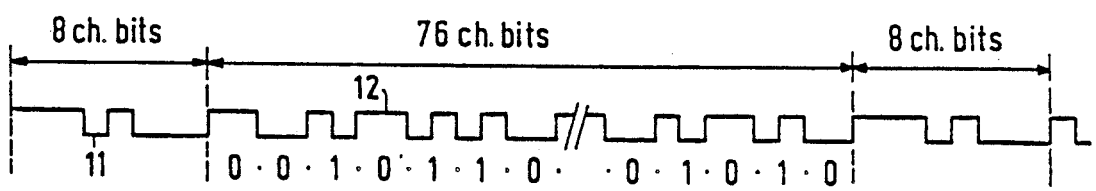
FIG.2
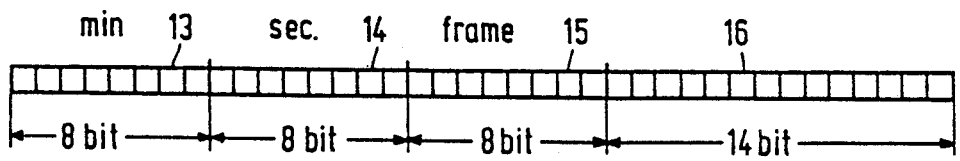
FIG.3

RECORDING/READING APPARATUS FOR INSCRIBABLE RECORD CARRIER AND ITS MANUFACTURE

BACKGROUND OF THE INVENTION

This invention relates to an optically readable record carrier of the inscribable type having a recording layer intended for recording an information pattern of optically detectable recording marks wherein a servo track is provided exhibiting a periodic track modulation which can be distinguished from the information pattern.

The invention additionally relates to apparatus for manufacturing a record carrier including an optical system for scanning a radiation-sensitive layer of the carrier along a path corresponding to the servo track to be formed and a deflection device for deflecting the radiation beam so that the position of incidence of the beam on the radiation-sensitive layer is deflected in a direction perpendicular to the scanning direction in conformity with a control signal applied to the deflection device.

The invention also relates to apparatus for recording information on a record carrier including an arrangement for recording a pattern of recording marks representing the information in the servo track. The arrangement includes: a scanner for scanning the servo track with a radiation beam so that the radiation beam reflected or transmitted by the record carrier is modulated by the track modulation: a detector for detecting the reflected or transmitted radiation beam: and a circuit for deriving a clock signal whose frequency is determined by the track modulation from the radiation received by the detector.

The invention further relates to apparatus for reading a record carrier in whose servo track an information signal is recorded as a pattern of recording marks. The apparatus includes: a scanning device for scanning the servo track with substantially constant velocity by means of a radiation beam: the radiation beam reflected or transmitted by the record carrier being modulated by the track modulation and the pattern of recording marks: a detector for detecting the reflected or transmitted radiation beam: a circuit for deriving an information signal representing the recorded information from the radiation detected by the detector, and a circuit for deriving a clock signal whose frequency is dictated by the track modulation from the radiation detected by the detector.

This type of record carrier including associated apparatus are known from German patent document Offenlegungsschrift No. 3100421.

This conventional record carrier has a spiral servo track exhibiting a track modulation of constant frequency. As the spiral servo track is scanned by a radiation beam during reading and/or recording, this track modulation modulates the radiation beam. This modulated beam is detected and from the modulation a clock signal is derived which is utilized for controlling the recording and/or reading process.

The servo track is divided into information-recording areas between which synchronization areas are interposed. The information-recording areas are intended for recording the information. The synchronization areas contain position information in the form of the address of the adjacent information-recording area. During scanning the position information in the synchronization areas, it may appear possible to derive from the reflected radiation beam the identity of the portion of the record carrier that is being scanned. This would enable a specific portion of the disc to be located rapidly and accurately.

However, the conventional record carrier has the disadvantage that the information-recording areas are constantly interrupted by synchronization areas. This is a drawback, in particular when EFM-encoded information is recorded on the record carrier. This is because such a recording method requires an uninterrupted information-recording area.

SUMMARY OF THE INVENTION

It is an object of the present invention to provide a technique that is better adapted to record EFM-encoded signals and which during scanning makes it possible to derive from the light beam reflected by the record carrier, the identity of the portion of the disc that is being scanned.

In accordance with that one aspect of the invention, a record carrier of this type is characterized in that the frequency of the track modulation is modulated in conformity with a position-information signal comprising position code signals which alternate with position-synchronization signals.

In accordance with another aspect of the invention, apparatus for manufacturing the record carrier includes a signal generator for generating a periodic signal which functions as the control signal and whose frequency is modulated in conformity with a position-information signal having position-code signals alternating with position-synchronization signals.

In accordance with a further aspect of the invention, apparatus for recording information, comprises an FM demodulation circuit for recovering the position-information signal from the clock signal and means for separating the position-code signals and the position-synchronization signals.

In accordance with a still further aspect of the invention, apparatus for reading information, comprises an FM demodulation circuit for recovering the position-information signal from the clock signal and means for separating the position-code signals and the position-synchronization signals.

When the track is scanned during information recording or reading, it is thus possible to recover the position-information signal from the scanning-beam modulation produced by the track modulation. As a result of the insertion of position-synchronization signals, the position-code signals representing the instantaneous scanning position can then be recovered simply.

Since the track modulation is situated in the information-recording area, the information-recording area need no longer be interrupted by synchronization areas. Moreover, the center frequency of the modulation of the reflected radiation beam produced by the track modulation can be utilized for measuring the scanning velocity for the purpose of scanning velocity control. For such a velocity control, it is advantageous to utilize an embodiment of the record carrier which is characterized in that the position-code signal is a biphase-mark modulated signal, the position-synchronization signal having a waveform which differs from the biphase-mark-modulated signal. This is because a biphase-mark-modulated signal has a frequency spectrum which contains virtually no low-frequency components, so that the velocity control, which responds mainly to low-frequency disturbances, is hardly affected by the FM track modulation.

A further illustrative embodiment of the record carrier is characterized in that the width of the servo track is between $0.4 \times 10^{-6}$ meters and $1.25 \times 10^{-6}$ meters, the track modulation being in the form of a track wobble, or lateral periodic deviation, having an amplitude which is substantially equal to $30 \times 10^{-9}$ meters. This embodiment of the record carrier has the advantage that the track modulation can be formed simply during the mastering process by giving the scanning; beam used for recording an excursion in a direction perpendicular to the scanning direction. Moreover, for a wobble amplitude of approximately $30 \times (10^{-9})$ meters the effect of the track wobble on the recording process is found to be substantially nil. Indeed, the deviations of the scanning-beam position relative to the center of the track during scanning are negligibly small. Moreover, for such a low amplitude the minimal distance between two adjacent servo tracks does not increase significantly. On the other hand, such a low amplitude is found to be amply sufficient for a reliable recovery of the position-information signal.

If it is desirable to record EFM signals in conformity with the conventional CD Audio standard, it is advantageous to use an illustrative embodiment of the record carrier which is characterized in that the average period of the track modulation is between $54 \times 10^{-6}$ meters and $64 \times 10^{-6}$ meters, the distance between the starting positions of the track portions which are modulated in conformity with the synchronization signal corresponding to 294 times the average period of the track modulation.

This embodiment provides velocity control in such a way that the center frequency of the scanning-beam modulation produced by the track modulation is maintained equal to a reference frequency of 22.05 kHz at a scanning velocity of 1.2-1.4 meters per second which is customary for recording EFM signals. The bit rate of an EFM signal (4.3218 MHz) is an integral multiple of 22.05 kHz, so that the reference frequency can be derived simply from the EFM bit rates by means of frequency coding. As the distance between track portions modulated by the synchronization signals is 294 times the average period of the track modulation the repetition rate of the recovered synchronization signals is 75 Hz, which is exactly equal to the repetition rate of the subcode-synchronization signals contained in the standard EFM signal This provides a simple synchronization between the position-synchronization signals derived from the track modulation and the process of recording the EFM signals.

A further illustrative embodiment of the record carrier is characterized in that the position-code signal indicates the time needed at the nominal scanning velocity to cover the distance between the beginning of the track and the position where the track exhibits the track modulation corresponding to the position-code signal.

This embodiment has the advantage that the position information provided by the position-code signal is of the same type as the position information provided by the absolute-time codes in the EFM signal, enabling a simple control system for the recording and read apparatus to be obtained.

BRIEF DESCRIPTION OF THE INVENTION

Further embodiments and the advantages thereof will now be described in more detail, by way of example, with reference to FIGS. 1 to 12, of which FIGS. 1a -1d show embodiments of the record carrier in accordance with the invention, FIG. 2 shows a position-information signal, FIG. 3 shows a suitable format for the position-information codes, FIG. 4 shows an embodiment of a recording and/or read apparatus in accordance with the invention, FIGS. 5 and 12 are flow-charts of programs for a microcomputer utilized in the recording and/or read apparatus, FIG. 6 shows an example of a demodulation circuit for use in the recording and/or read apparatus, FIG. 7 shows a track portion formed with a pattern of recording marks to a highly enlarged scale, FIG. 8 shows an example of an apparatus for manufacturing a record carrier by means of the method in accordance with the invention, FIG. 9 shows an example of a modulation circuit for use in the apparatus shown in FIG. 8, FIG. 10 shows a number of signals appearing in the modulator circuit as a function of time t, and FIG. 11 illustrates the position of the time synchronization signals of the recorded signal relative to the pre-recorded position-synchronization signals in the servo track.

DETAILED DESCRIPTION OF THE INVENTION

Figure 4:
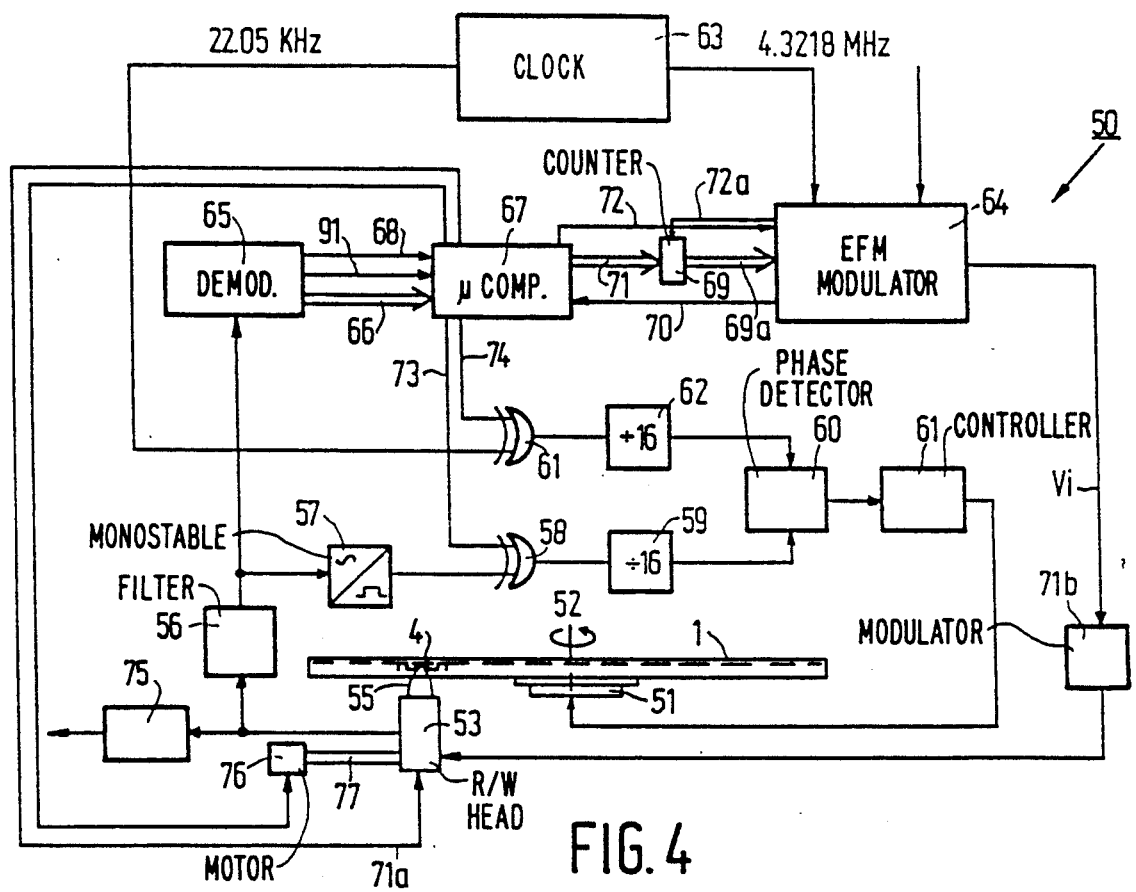

The illustrative embodiments of the invention described hereinafter are particularly suitable for recording EFM signals in conformity with the CD-Audio or CD-ROM standard. However, it is to be noted that the scope of the invention is not limited to these illustrative embodiments.

Before the embodiments are described a brief description will be presented of those characteristics of the EFM signal which are relevant for a correct understanding of the invention. The EFM signal comprises subcode frames of 98 EFM frames each. Each EFM frame comprises 588 EFM channel bits. The first 24 bits of these 588 EFM channel bits are employed for a frame synchronization code, which has a pattern which can be distinguished from the remainder of the EFM signal, the other 564 EFM channel bits being arranged as 14-bit EFM symbols. The synchronization code and the EFM symbols are always separated from one another by 3 merging bits. The available EFM symbols are divided into 24 data symbols, each representing 8 bits of the non encoded signal, 8 parity symbols for the purpose of error correction, and one control symbol representing 8 control bits. The 8 bits represented by each EFM control symbol are designated P, Q, R, S, T, U, V, W bits, each having a fixed bit position. The 16 bits of the EFM control symbols in the first two EFM frames of each subcode frame form a subcode-synchronization signal indicating the beginning of the subcode frame. The remaining 96 Q bits of the 96 residual EFM frames constitute the subcode Q-channel. Of these bits, 24 bits are used to indicate an absolute time code. This absolute time code indicates the time which has elapsed from the beginning of the EFM signal. This time is expressed in minutes (8 bits), second (8 bits) and subcode frames (8 bits).

Further it is to be noted that the EFM signal code is d.c. free, which means that the EFM frequency spectrum exhibits hardly any frequency components in the frequency range below 100 kHz.

FIG. 1 represents a record carrier 1, FIG. 1a being a plan view, FIG. 1b illustrates a small portion of a sectional view taken on the line b—b, and FIG. 1c and FIG. 1d being plan views showing but a portion 2 of a first and a second illustrative embodiment of the record carrier 1 but to a highly enlarged scale. The information carrier 1 has a servo track 4, which is constituted, for example, by a preformed groove or ridge. The servo track 4 is intended for recording an information signal. For the purpose of recording, the record carrier 1 comprises a recording layer 6 which is deposited on the transparent substrate 5 and which is covered with a protective coating 7. The recording layer 6 is made of a material which, if exposed to suitable radiation, is subjected to an optically detectable change. Such a layer may be, for example, a thin layer of a metal such as tellurium by exposure to laser radiation of sufficiently high intensity this metal layer can be melted locally, so that this layer is locally given another reflection coefficient. When the servo track 4 is scanned by a radiation beam whose intensity is modulated in conformity with the information to be recorded, an information pattern of optically detectable recording marks is obtained which pattern is representative of the information.

The layer 6 may alternatively include different radiation-sensitive materials, for example magneto-optical materials or materials which upon heating are subject to a structural change, for example from amorphous to crystalline or conversely. A survey of such materials is given in the book "Principles of optical disc systems", Adam Hilgar Ltd., Bristol and Boston, pages 210-227.

A radiation beam aimed at the record carrier 1 for recording the information can be made to coincide accurately with the servo track 4 by means of the servo track, that is the position of the radiation beam in a radial direction can be controlled through a servo system utilizing the radiation reflected from the record carrier 1. The measurement system for measuring the radial position of the radiation spot on the record carrier may correspond to one of the systems as 25 described in the aforementioned book "Principle of optical disc systems".

In order to determine the position of the track portion being scanned relative to the beginning of the servo track a position information signal is recorded by means of a preformed track modulation, suitably in the form of a sinusoidal track wobble as shown in FIG. 1c.

However, other track modulations such as, for example track-width modulation (FIG. 1d), are also suitable. Since a track wobble is very simple to provide during the manufacture of the record carrier, a track modulation in the form of a track wobble is to be preferred.

It is to be noted that in FIG. 1, the track modulation has been exaggerated greatly. In reality, a wobble having an amplitude of $30 \times 10^{-9}$ meters in the case of a track width of approximately $10^{-6}$ meters is found to be adequate for a reliable detection of the scanning-beam modulation. A small amplitude of the wobble has the advantage that the distance between adjacent servo tracks can be small.

An attractive track modulation is where the track-modulation frequency is modulated in conformity with the position-information signal.

FIG. 2 demonstrates an example of a suitable position-information signal comprising position-code signals 12 which alternate with position-synchronization signals 11. Each position-code signal 12 may comprise a biphase-mark modulated signal having a length of 76 channel bits, which signal represents a position-information code of 38 code bits. In a biphase-mark modulated signal, each code bit is represented by two successive channel bits. Each code of a first logic value, in the present example "0", is represented by two bits of the same logic value. The other logic value ("1") is represented by two channel bits of different logic values. Moreover, the logic value of the biphase-mark modulated signal changes after every pair of channel bits (see FIG. 2), so that the maximum number of successive bits of the same logic value is two at the most. The position-synchronization signals 11 are selected in such a way that they can be distinguished from the position-doce signals. This is achieved by selecting the maximum number of successive bits of the same logic value in the position-synchronization signals to be equal to three. The position-information signal shown in FIG. 2 has a frequency spectrum which exhibits hardly any low-frequency components. The advantage of this will be explained hereinafter.

As stated in the foregoing, the position-information signal represents a 38-bit position-information code. The 38-bit position-information code may comprise a time code indicating the time needed to cover the distance from the beginning of the track to the position where the position-information signal is situated during scanning at nominal scanning velocity. Such a position-information code may comprise, for example, a number of successive bytes, as used for example in recording EFM modulated information on CD-Audio and CD-ROM discs. FIG. 3 represents a position-information code which is similar to the absolute time code employed in the case of CD-Audio ad CD-ROM and which comprises a first BCD-encoded portion 13 indicating the time in minutes, a second BCD-encoded portion 14 indicating the time in seconds, a third BCD-encoded portion 15 indicating a subcode-frame number, and a fourth portion 16 comprising a plurality of parity bits for the purpose of error detection. Such a position-information code for indicating the position in the servo track 4 is of advantage if an EFM-signal modulated in conformity with the CD-Audio or CD-ROM standard is to be recorded. In that case, the absolute time codes present in the subcode Q-channel are of the same type as the position-information code represented by the track modulation.

In the case of a record carrier intended for recording EFM modulated signals in conformity with the CD-Audio or the CD-ROM standard, it is advantageous that for a customary scanning velocity (1.2-1.4 m/s) the average frequency of the intensity modulation produced in the scanning beam by the track modulation is 22.05 kHz. This means that the average period of the track modulation should be between $54 \times 10^{-6}$ meters and $61 \times 10^{-6}$ meters. In this technique, the record carrier velocity is controlled very simply by comparing the phase of the detected track modulation with the phase of a reference signal of a frequency which is derived simply by frequency division from the 4.3218 NHz frequency (which is the bit rate of the EFM signal, which is required anyway for recording an EFM signal. Moreover, the frequency of the track modulation is situated outside the frequency band required for recording the EFM signal, so that the EFM signal and the position-information signal hardly interact with each other during reading. In addition, this frequency is not within the frequency band of the tracking system, so that the tracking is hardly affected by the track modulation.

If the channel-bit rate of the position-information signal is selected to be 6300 Hz, the number of position-information codes which can be read is 75 per second, which is exactly the same as the number of absolute time codes per second of the EFM signal to be recorded. If during recording the phase of the subcode-synchronization signal, which indicates the beginning of the absolute time code, is locked to the phase of the position-synchronization signals represented by the track modulation, the absolute time indicated by the position-information code remains in synchronism with the absolute time codes in the recorded EFM signal.

Figure 11:
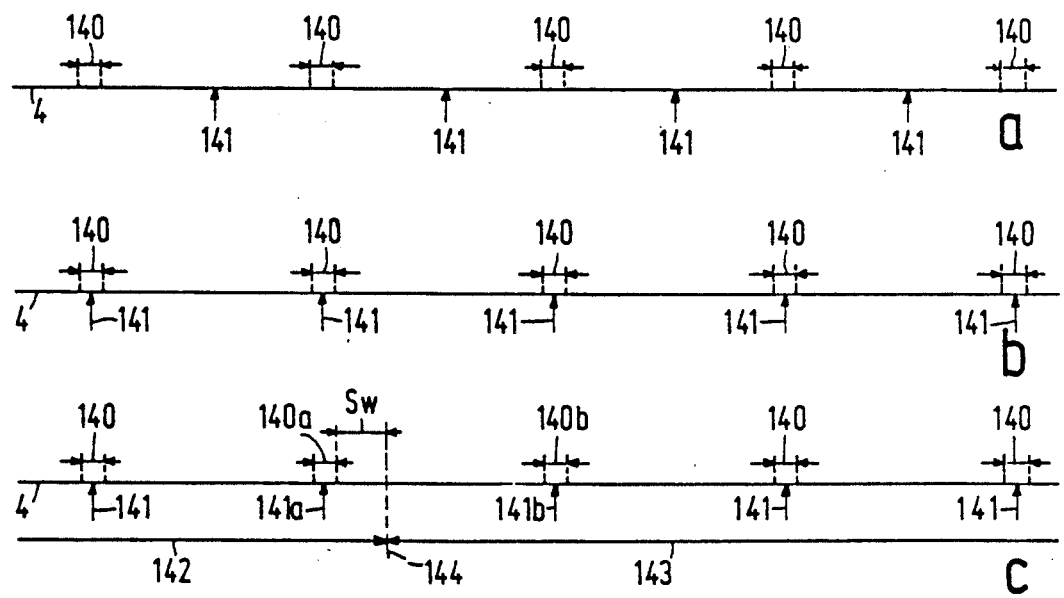

FIG. 11a shows the position of the recorded subcode-synchronization signals relative to the track portions modulated in conformity with the position-synchronization signals 11 if during recording the phase relationship between the position-synchronization signal and the subcode-synchronization signal is maintained constant. The servo-track portions modulated in conformity with the position-synchronization signals 11 bear the reference numeral 140. The positions in which the subcode-synchronization signals are recorded are indicated by the arrows 141. As will be evident from FIG. 11a, the time indicated by the position-information code remains in synchronism with the time indicated by the absolute time code. If at the beginning of a recording the initial value of the absolute time code is adapted to the position information code, the track position indicated by the absolute time code will always be equal to the track position indicated by the position-information code. This has the advantage that for locating specific portions of the recorded signal both the absolute time code and the position-information code may be used.

If as is indicated in FIG. 11b, the track positions 141, in which the subcode-synchronization code is recorded, coincide with the track portions 140 which are modulated in conformity with the position-information signals, the difference between the track positions represented by the position-information code and the absolute time code will be minimal. Therefore, it is then advisable to minimize the phase difference between the position-synchronization signals and the subcode-synchronization signals during recording.

During reading of an EFM signal, the EFM channel clock is recovered from the signal being read. When a recorded EFM signal is read, the EFM channel clock should therefore be available as soon as the first subcode frame with useful information is read. This can be achieved, for example, by adding one or more EFM blocks with dummy information at the beginning of the EFM signal. This method is particularly suitable for recording an EFM signal in a completely blank servo track.

However, if the EFM signal is to be recorded contiguously with a previously recorded EFM signal, it is preferred to make the position in the servo track 4 where the recording of the new EFM signal is to begin coincide substantially with the position where the recording of the previously recorded EFM signal has ceased. As in practice, the accuracy with which the beginning and end can be positioned is of the order of magnitude of a few EFM frames, either a small blank track portion will be left between the track portions in which the signals are recorded or the first and the second signal will overlap one another.

Such an overlapping or blank track portion results in the channel clock recovery being disturbed. Therefore, it is preferred to select the boundary 144 between two recorded EFM signals 142 and 143 in such a way that it is situated in an area between track portions 140, as is indicated in FIG. 11c. The portion from the boundary 144 up to the beginning of the first subcode frame containing useful information is then sufficiently long to restore the channel clock recovery before the beginning of the first subcode frame containing useful information is reached. Preferably the position of the boundary 141 is selected to be situated before the center between the track portions 140a and 140b, because in that case a comparatively long time is available in which the channel-clock recovery can be restored. However, the boundary 144 should be situated sufficiently far from the end of the last subcode frame containing useful information of the recorded EFM signal 112 (this end corresponds to position 141a), in order to prevent that the last complete subcode frame of the EFM signal 142 from being overwritten and, consequently, the last part of the information in the last subcode frame of the EFM signal 142 from being destroyed as a result of inaccuracies in positioning of the beginning of the recording of the EFM signal 143. Apart from the destruction of recorded information, such an overlap also results in the absolute time code belonging to the last subcode frame and the subcode-synchronization signal end of the subcode frame no longer being read reliably. Since the absolute time code and subcode-synchronization signals are used for controlling the read process, it is desirable that the number of non-readable subcode-synchronization signals and absolute time-code signals is minimal. It will be evident that the recorded information of the EFM signal 142 between position 141a and the boundary 144 cannot be read reliably. Therefore, it is also preferred to record dummy information, for example EFM pause-code signals in this part.

FIG. 4 illustrates recording and read apparatus 50 in accordance with the invention wherein an EFM signal is recorded so that the position synchronization signals 11 represented by the track modulation remain in synchronism with the subcode-synchronization signals in the recorded EFM modulated signal. The device 50 comprises a drive motor 51 for rotating the record carrier 1 about an axis 52. An optical read/write head 53 of a customary type is arranged opposite the rotating record carrier 1. The read/write head 53 has a laser for generating a radiation beam 55 which is focused to form a tiny scanning spot on the record carrier 1.

The read/write head 53 can be operated in two modes, namely: a first mode (read mode), in which the laser produces a radiation beam of a constant intensity inadequate to bring about the optically detectable change in the recording layer 6, and a second mode (recording mode, in which the radiation beam 55 is modulated depending on an information signal to be recorded in order to form a pattern of recording marks having modified optical properties and corresponding to the information signal Vi in the recording layer 6 at the location of the servo track 4.

The recording and read apparatus 50 has tracking of a customary type, which keeps the scanning spot produced by the radiation beam 55 centered on the servo track 4. As the servo track 1 is scanned the reflected radiation beam 55 is modulated by the track modulation. By means of a suitable optical detector, the read/write head 53 detects the modulation of the reflected beam and produces a detection signal Vd representing the detected modulation.

By means of a band-pass filter 56 having a mid frequency of 22.05 kHz, the frequency component modulated in conformity with the position-information signal and produced by the track modulation is extracted from the detection signal. By means of an edge-restoring circuit, for example a level controlled monostable 57, the output signal of the filter 56 is converted into a binary signal, which is applied to a frequency divider 59 via an EXCLUSIVE-OR gate 58. The output of the frequency divider 59 is connected to one of the inputs of a phase detector 60. A 22.05 kHz reference signal generated by a clock-generation circuit 63 is applied to a frequency divider 62 via an EXCLUSIVE-OR gate 61. The output of the frequency divider 62 is connected to the other input of the phase detector 60. A signal which is indicative of the phase difference, determined by the phase detector 60 between the signals on the two inputs is applied to an energizing (controller) circuit 61 for generating an energizing signal for the drive motor 51. The feedback control circuit thus formed constitutes a phase-locked-loop velocity control system, which minimizes the detected phase difference which is a measure of the velocity deviation.

The bandwidth of the phase-locked-loop velocity control system is small (generally of the order of magnitude of 100 Hz) in comparison with the bit rate 6300 Hz of the position-information signal. Moreover, the position-information signal with which the frequency of the track modulation has been modulated does not contain any low-frequency components, so that this FM modulation does not influence the velocity control, the scanning velocity thus being maintained constant at a value for which the average frequency of the frequency components produced in the detection signal Vd by the track modulation is maintained at 22.05 kHz, which means that the scanning velocity is maintained at a constant value between 1.2 and 1.4 meters per second.

For the purpose of recording, the apparatus 50 comprises an EFM modulation circuit 64 of a customary type, which circuit converts the applied information into a signal Vi modulated in conformity with the CD-ROM or CD-Audio standard. The EFM signal Vi is applied to the write/read head via a suitable modulation circuit 71b, which converts the EFM signal into a sequence of pulses, in such a way that a pattern of recording marks corresponding to the EFM signal Vi is recorded in the servo track 4. A suitable modulation circuit 71b is known, inter alia from U.S. Pat. No. 4,473,829. The EFM modulator is controlled by a control signal of a frequency equal to the EFM bit rate of 4.3218 MHz. The control signal is generated by the clock-generation circuit 63. The 22.05 kHz reference signal, which is also generated by the clock-generation circuit 63, is derived from the 4.3218 MHz signal by frequency division, so that a fixed phase-relationship is established between the control signal of the EFM modulator 61 and the 22.05 kHz reference signal. Since the control signal for the EFM modulator is phase-locked to the 22.05 kHz reference signal, the detection signal Vd is also phase-locked to this 22.05 kHz reference signal, so that the absolute time codes generated by the EFM modulator remain in synchronism with the position-information codes represented by the track modulation of the servo track 4 being scanned. However, if the record carrier 1 exhibits flaws, for example scratches dropouts etc., it is found that this may give rise to an increasing phase difference between the position-code signals and the absolute time codes.

In order to preclude this increasing phase difference, the phase difference between the subcode-synchronization signals generated by the EFM modulator 64 and the position-synchronization signals being read is determined and the scanning velocity is corrected depending on the phase difference thus determined. For this purpose a demodulation circuit 65 is used Which extracts the position synchronization signals and the position-code signals from the output signal of the filter 56 and, moreover, recovers the position-information codes from the position-code signals.

The demodulation circuit 65, to be described in detail hereinafter, applies the position-information codes to a microcomputer 67 of a customary type via a bus 66. Moreover, the demodulation circuit 65 supplies a detection pulse Vsync via a signal line 68, which pulse indicates the instant at which a position synchronization signal is been detected. The EFM modulator 64 comprises customary means for generating the subcode signals and for combining the subcode signals with the other EFM information. The absolute time codes can be generated by means of a counter 69 and can be applied to the EFM modulator 64 via the bus 69a. The count of the counter 69 is incremented in response to control pulses having a frequency of 75 Hz. The control pulses for the counter 69 are derived from the 4.3218 MHz control signal by frequency division by means of the EFM modulator and are applied to the count input of the counter 69 via a line 72a.

The EFM modulator 64 moreover generates the signal Vsub which indicates the instant at which the subcode-synchronization signal is generated. The signal Vsub is applied to the microcomputer 67 via a signal line 70. The counter 69 comprises inputs for setting the count to a value applied via these inputs. The inputs for setting the count are connected to the microcomputer 67 via a bus 71. It is to be noted that it is also possible to include the counter 69 in the microcomputer 61.

The microcomputer 67 is loaded with a program to position the read/write head 53 opposite the desired track prior to recording. The position of the read/write head 53 relative to the desired track is determined by means of the position-information codes generated by the demodulation circuit 65 and the read/write head 53 is moved in a radial direction which depends on the position thus determined until the read/write head has reached the desired position. For moving the read/write head 53 the device comprises the customary means for moving the read/write head 53 in a radial direction, for example a motor 76 controlled by the microcomputer 67 and a spindle 77. As soon as the desired track portion is reached the initial count of the counter 69 is adjusted to set the initial value for the absolute time code to the value corresponding to the position-information code of the track portion being scanned. Subsequently the read/write head 53 is set to the write mode by the microcomputer 67 via a signal line 71a and the EFM modulator 64 is activated via a signal line 72, to start the recording, the recording of the absolute time codes in the EFM signal being maintained in synchronism, in the same way as described hereinbefore, with the position-code signal represented by the track modulation at the recording position. This has the advantage that the recorded absolute time codes always correspond to the position-code signals represented by track modulation at the track portion in which the absolute time codes are recorded. This is of particular advantage if different information signals have been recorded after one another, because the absolute time-code signals do not exhibit any abrupt changes at the transition between two successively recorded EFM signals. Thus, in order to locate specific portions of the recorded information signals it is possible to utilize both the absolute time codes recorded together with the information signal and the position-code signals represented by the track modulation, which yields a highly flexible retrieval system.

Figure 7:
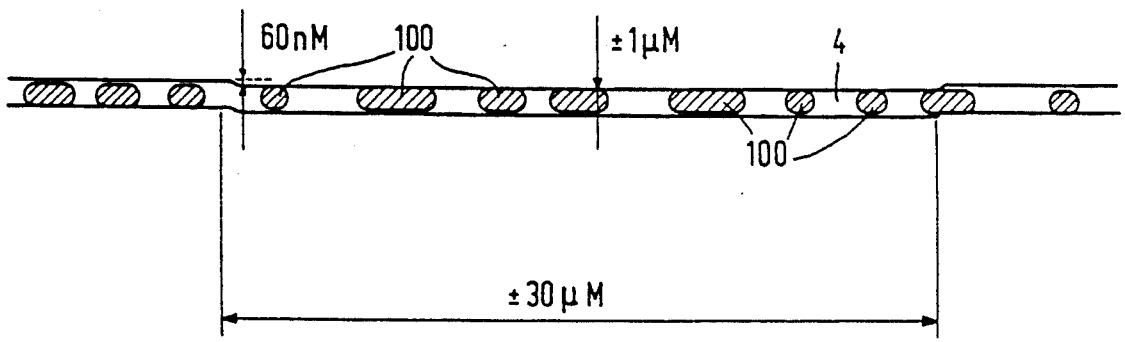

By way of illustration FIG. 7 shows a pattern of recording marks 100 formed when the EFM signal Vi is recorded in the servo track 4. It is to be noted again that the bandwidth of the tracking control is substantially smaller than the frequency of the scanning-beam modulation caused by the track modulation (in the present case in the form of a track wobble), so that the tracking control does not respond to tracking errors caused by the track undulation. Therefore, the scanning beam will not exactly follow the track but will follow a straight path which is representative of the average position of the center of the servo track 4. However, the amplitude of the track wobble is small, suitably of the order of magnitude of $30 \times 10^{-9}$ meters ($=60 \times 10^{-9}$ meters peak to peak), in comparison with the track width, which is of the order of magnitude $10^{-6}$ meters, so that the pattern of recording marks 100 is always substantially the centered relative to the servo track 4. It is to be noted that for the sake of clarity a rectangular track wobble is shown. However, in practice it is preferred to use a sinusoidal track wobble, because this minimizes the number of high-frequency components in the modulation of the scanning beam 55 produced by the track modulation, so that the EFM signal being read is affected to a minimal extent.

During recording the microcomputer 67 performs a program to derive from the signals Vsync and Vsub applied via the signal lines 68 and 70 derive the time interval between the instant at which a synchronization signal is detected in the track portion being scanned and the instant at which the subcode-synchronization signal is generated. As long as the position synchronization signal leads the subcode-synchronization signal generation by more than a predetermined threshold value the microcomputer 67 supplies one or more additional pulses to the divider 59 via the signal line 73 and the EXCLUSIVE-OR gate 58 after every synchronization signal detection, which causes the phase difference detected by the phase detector 60 to increase and which causes the energizing circuit 61 to reduce the speed of the drive motor 53, so that the Phase difference between the detected position-synchronization signals and the generated subcode-synchronization signal decreases.

As long as the detected synchronization signal lags the generated subcode-synchronization signal by more than a predetermined threshold value the microcomputer 67 applies additional pulses to the divider 62 via a signal line 74 and the EXCLUSIVE-OR gate 61. This causes the phase difference detected by the phase detector to decrease, as a result of which the speed of the drive motor 53 increases and the phase difference between the detected position-synchronization signals and the generated subcode-synchronization signals decreases. In this way a permanent synchronization between the two synchronizing signals is maintained. It is to be noted that in principle it is also possible to adapt the write velocity instead of the scanning velocity in order to maintain the desired phase relationship. This is possible, for example, by adapting the frequency of the control signal of the EFM modulator 64 depending on the detected phase difference.

Figure 5:
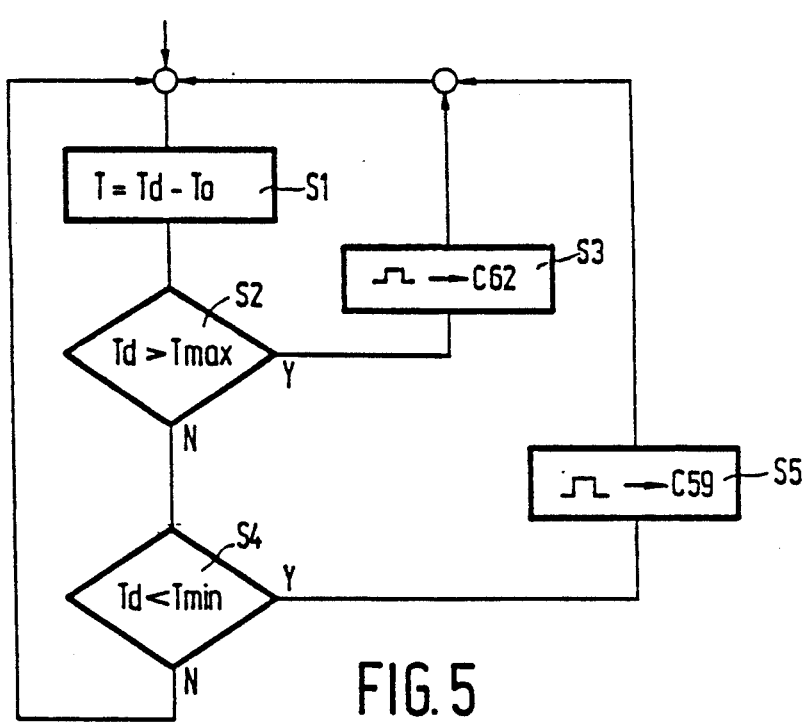

FIG. 5 is a flowchart of a suitable program for maintaining the synchronization The program comprises a step S1 in which the time interval T between the detection instant Td of the synchronization signal read and the generation instant To of the subcode-synchronization signal is determined in response to the signals Vsub and Vsync on the signal lines 68 and 70. In step S2, it is ascertained whether the time interval T is greater than a predetermined threshold value Tmax. If it is greater, step S3, is carried out, in which an additional pulse is applied to the counter 62. After step S3 step S1 is repeated.

However, if the time interval T thus determined is smaller than Tmax, step S2 is followed by step S4, in which it is ascertained whether the time interval T is smaller than a minimum threshold value Tmin. If it is smaller, step S5 is performed, in which an additional pulse is applied to the counter 59. After step S5, step S1 is repeated. If during step S4 it is found that the time interval is not smaller than the threshold value, no additional pulse is generated but the program proceeds with step S1.

Figure 12:
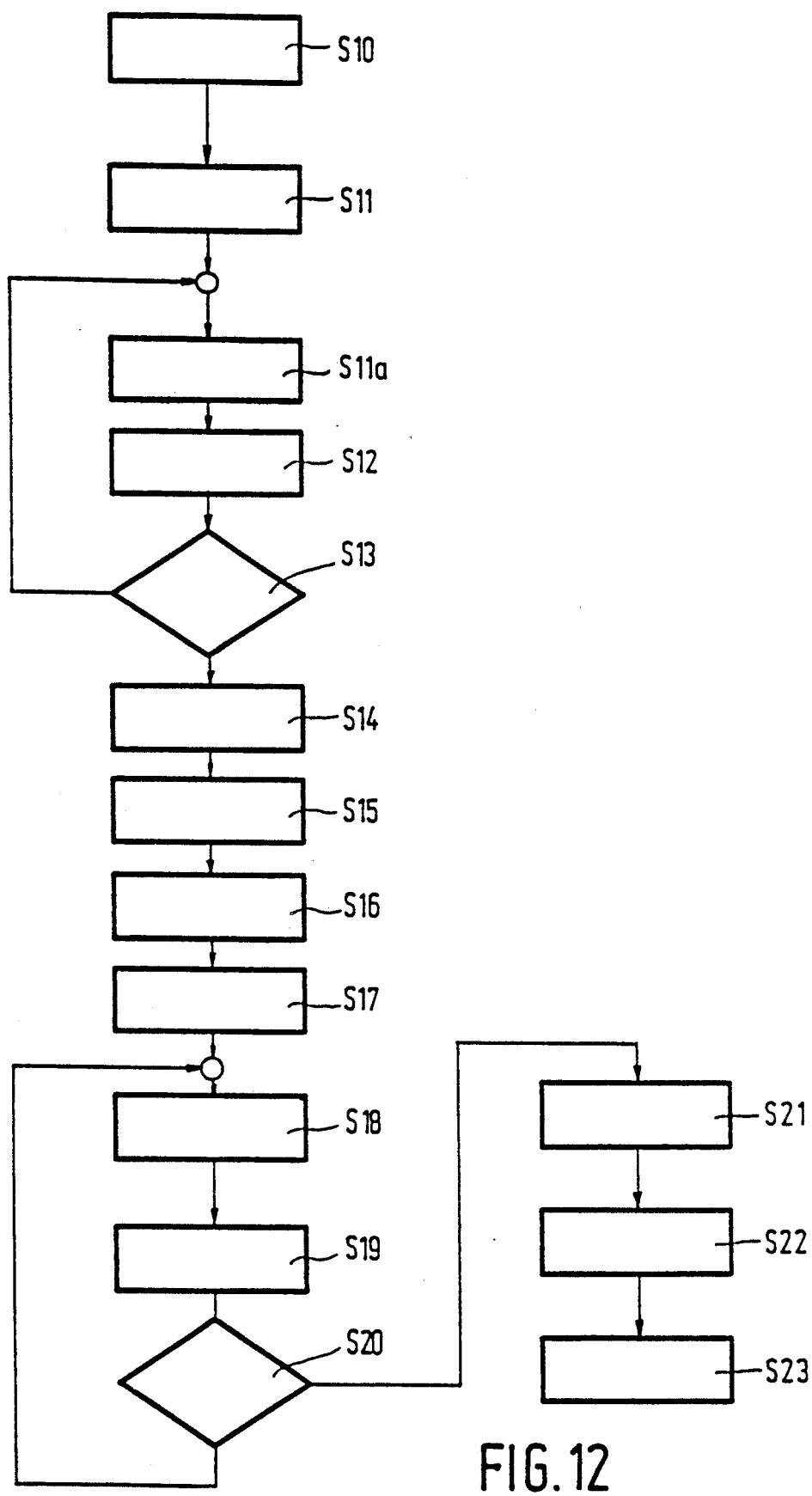

FIG. 12 provides a flow chart of a suitable program for the microcomputer 67 for recording an EFM signal contiguously with a previously recorded EFM signal. The program includes a step S10 in which the position-information code AB is determined, which code indicates the position where the previously recorded information ends. This position information code can be stored in the memory of the microcomputer 67, for example, after recording of the preceding signal. Moreover, in step S10 the position-information code AE is derived from the number of subcode frames to be recorded, which code indicates the position where the recording should end. This information can be generated, for example, by the storage medium in which the information to be recorded is stored and can be applied to the microcomputer 67. This storage medium and the method of detecting the length of the signal to be recorded fall beyond the scope of the present invention and are therefore not described any further. After step S10 step S11 is performed, in which in conventional manner the read/write head 53 is positioned opposite a track portion which precedes the point where the recording of the EFM signal should begin Control means suitable for this purpose are described comprehensively inter alia in U.S. Pat. No. 4,106,058.

Subsequently in step 11a the detection signal Vsync is awaited which detection signal is supplied by the demodulation circuit 65 via the signal line 68 and indicates that a newly read position-information code is applied to the bus 66. In step S12, this position information code is read in and in step S13 it is ascertained whether this read in position-information code corresponds to the position information code AB indicating the starting point of the recording. If this is not the case, step S13 is followed by step S11a. The program loop of steps S11a, S12 and S13 is repeated until the read in position-information code corresponds to the position-information code AB. After this, in step S11, the initial value of the absolute time code in the counter 69 is set in conformity with the position information code AB. Subsequently, in step S15, the EFM modulator 61 is put into operation via the signal line 72.

In step S16 a waiting time Td is observed, which time corresponds to the displacement of the scanning spot over a distance corresponding to the distance SW between the boundary 144 and the preceding track portion 140 (see FIG. 11c). At the end of the waiting time, the position of the scanning spot in the servo track 4 corresponds to the desired starting position of the recording and the read/write head 53 is set to the write mode during step S17, after which recording is started. Subsequently, in step S18 every following detection pulse Vsync is awaited and after this, in step S19, the detected position-information code is read in, upon which it is ascertained in step S20 whether the read-in position-information code corresponds to the position-information code AE indicating the end of the recording. In the case of non-correspondence the program proceeds with step S18 and in the case of correspondence a waiting time Td is observed in step S21 before proceeding with step S22. In step S22 the read/write head 53 is again set to the read mode. Subsequently in step S23 the EFM modulator 61 is de-activated.

The above method of determining the track positions indicating the beginning and the end of the recording utilizes the prerecorded position-information codes. However, it is to be noted that it is not strictly necessary to determine the position-information codes in order to detect the beginning and end positions. For example, by counting prerecorded position-synchronization signals from the beginning of the servo track 4, it is also possible to detect the position of the track portion being scanned.

Figure 6:
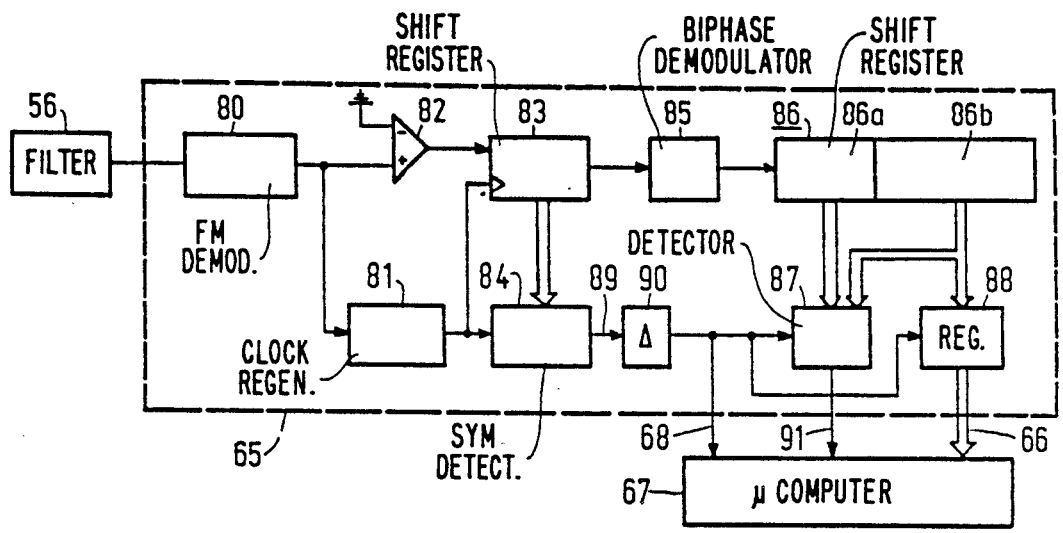

FIG. 6 provides an illustrative embodiment of the demodulation circuit 65 in detail. The demodulation circuit 65 comprises an FM demodulator 80, which recovers the position-information signal from the output signal of the filter 56. A channel clock regeneration circuit 81 regenerates the channel clock from the recovered position-information signal.

The position-information signal is further applied to a comparator circuit 82, which converts this signal into a binary signal which is applied to an 8-bit shift register 83, which is controlled by the channel clock. The parallel outputs of the shift register 83 are fed to a synchronization signal detector 84, which detects whether the bit pattern stored in the shift register corresponds to the position synchronization signal. The serial output of the shift register 83 is connected to a biphase-mark demodulator 85 for the recovery of the code bit of the position-information code represented by the biphase-mark modulated position-code signal. The recovered code bits are applied to a shift register 86 which is controlled by a clock frequency equal to half the channel-clock frequency and which has a length equal to the number of bits (38) of the position-code signal.

The shift register 86 comprises a first section 86a having a length of 14 bits and a second section 86b having a length of 24 bits and following the first section 86a.

The parallel outputs of the first section 86a and the second section 86b are fed to an error detection circuit 87. The parallel outputs of the second section 86b are fed to a parallel-in parallel-out register 88.

The position-information code is recovered as follows. As soon as the synchronization signal detector 84 detects the presence of a bit pattern corresponding to the position synchronization signal in the shift register 83 a detection pulse is generated which is applied to a pulse delay circuit 90 via a signal line 89. The circuit 90 delays the detection pulse by a specific time corresponding to the processing time of the biphase-mark modulator so that after the instant at which the detection pulse from the signal line 68 appears on the output of the delay circuit 90 a complete position-information code is present in the shift register 86. The delayed detection pulse on the output of the circuit 90 is also applied to the load input of the register 88, so that the 24 bits representing the position-information code are loaded into the register 88 in response to the delayed detection pulse. The position-information code loaded into the register 88 is available on the output of the register 88, which outputs are connected to the microcomputer 67 via the bus 66. The error detection circuit 87 is also activated by the delayed detection pulses on the output of the circuit 90, after which the detection circuit 87 detects whether the received position-information code is reliable in conformity with a customary detection criterion. An output signal which indicates whether the position information is reliable is applied to the microcomputer 67 via a signal line 91.

Figure 8:
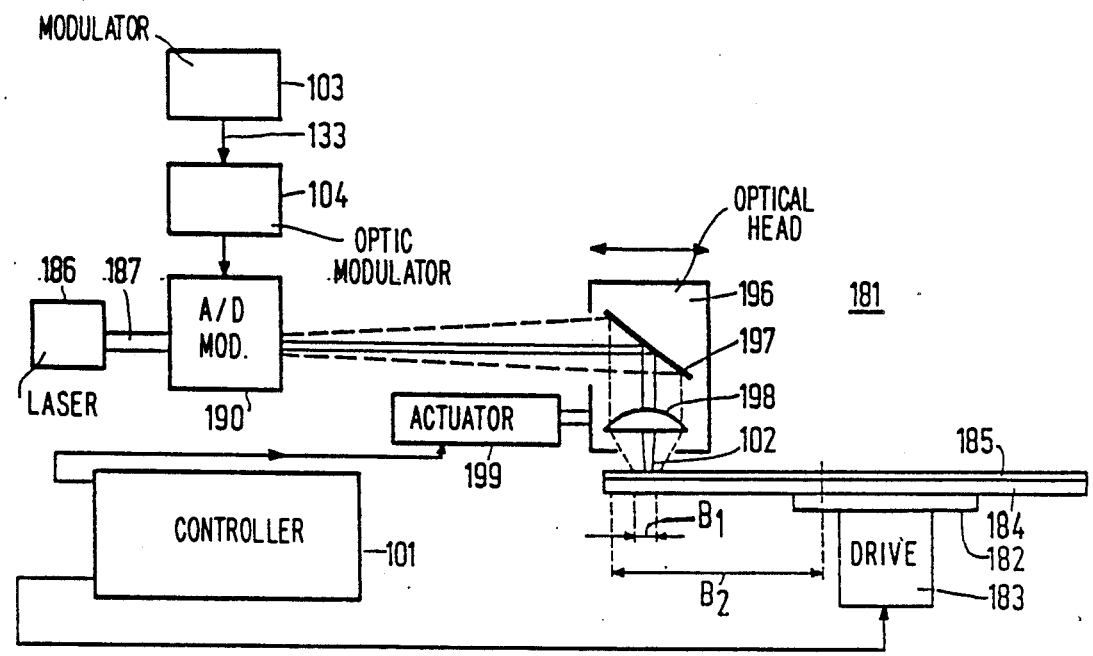

FIG. 8 depicts an illustrative embodiment of apparatus 181 for manufacturing a record carrier 1 in accordance with the invention. Apparatus 181 comprises a turntable 182 which is rotated by a drive means 183. The turntable 182 is adapted to support is disc-shaped carrier 184, for example a flat glass disc provided with a radiation sensitive layer 185, for example, in the form of a photoresist.

A laser 186 produces a light beam 187 which is projected onto the light-sensitive layer 185. The light beam 187 is first passed through a deflection device. The deflection device is of a type Which enables a light beam to be deflected very accurately within a narrow range. In the present example, the device is an acousto-optical modulator 190. The deflection device may also be formed by other devices, for example, a mirror which is pivotable through a small angle or an electro-optical deflection device. The limits of the deflection range are indicated by a broken line in FIG. 8. The light beam 187 deflected by the acousto-optical modulator 190 is passed to an optical head 196. The optical head 196 comprises a mirror 197 and an objective 198 for focusing the light beam onto the light-sensitive layer 185. The optical head 196 is radially movable relative to the rotating carrier 184 by an actuating device 199.

By means of the optical system described above the light 35 beam 187 is focused to form a scanning spot 102 on the radiation-sensitive layer 185, the position of this scanning spot 102 is dependent on the deflection of the light beam 187 by the acousto-optical modulator 190 and on the radial position the write head 196 relative to the carrier 184. In the illustrated position of the optical head 196, the scanning spot 102 can be moved within a range B1 by means of the deflection device 190. By the optical head 196, the scanning spot 102 can be moved through a range B2 for the indicated deflection.

The device 181 includes a control device 101, which may comprise for example the system described in detail in Netherlands Patent Application 8701418 which corresponds to U.S. Pat. No. 4,864,544, herewith incorporated by reference. By means of this control device 101, the speed of the drive means 183 and the radial velocity of the actuating device 199 are controlled in such a way that the light-sensitive layer 185 is scanned with a constant scanning velocity along a spiral path by the radiation beam 187. The device 181 further comprises a modulation circuit 103 for generating a periodic drive signal whose frequency is modulated in conformity with the position-information signal. The modulation circuit 103 will be described in detail hereinafter. The drive signal generated by the modulation circuit 103 is applied to a voltage-controlled oscillator 101 which generates a periodic drive signal for the acousto optical modulator 104, whose frequency is substantially proportional to the signal level of the drive signal. A deflection produced by the acousto-optical modulator 190 is proportional to the frequency of the drive signal in such a way that the displacement of the scanning spot 102 is proportional to the signal level of the drive signal. The modulation circuit 103, the voltage-controlled oscillator 101, and the acousto-optical modulator 190 are adapted to one another in such a way that the amplitude of the periodic radial excursion of the scanning spot 102 is approximately $30 \times 10^{-9}$ meters. Moreover, the modulation circuit 103 and the control circuit 101 are adapted to one another in such a way that the ratio between the average frequency of the drive signal and the scanning velocity of the radiation-sensitive layer 108 is situated between $22050/1.2$ m$^{-1}$ and $22050/1.4$ m$^{-1}$, which means that in every period of the drive signal the displacement of the radiation-sensitive layer 185 relative to the scanning spot is between $54 \times 10^{-6}$ meters and $64 \times 10^{-6}$ meters.

After the layer 185 has been scanned as described in the foregoing, it is subjected to an etching process to remove the portions of the layer 185 which have been exposed to the radiation beam 187 yielding a master disc in which a groove is formed which exhibits a periodic radial wobble whose frequency is modulated in conformity with the position-information signal. From this master disc, replicas are made on which the recording layer 6 is deposited. In record carriers of the inscribable type thus obtained the part corresponding to that part of the master disc from which the radiation-sensitive layer 185 has been removed is used as the servo track 4 (which may be either a groove or a ridge). A method of manufacturing a record carrier in which the servo track 4 corresponds to that part of the master disc from which the radiation-sensitive layer has been removed has the advantage of a very good reflection of the servo track 4 and hence a satisfactory signal-to noise ratio during read out of the record carrier. Indeed, the servo track 4 then corresponds to the highly smooth surface of the carrier 184, which is generally made of glass.

Figure 9:
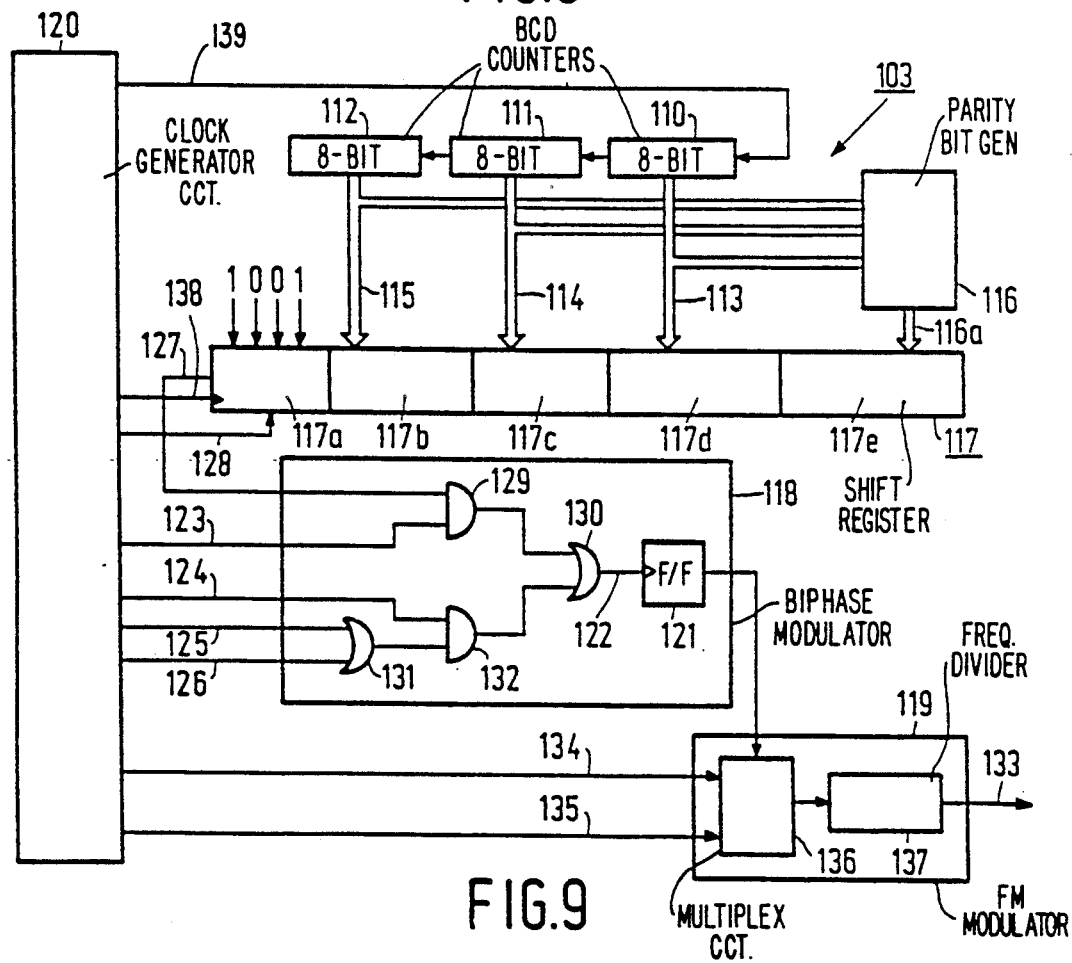

FIG. 9 provides an example of the modulation circuit 103 the modulation circuit 103 comprises three cascaded cyclic 8-bit BCD counters 110, 111 and 112. The counter 110 is an 8-bit counter and has a counting range of 75. When its maximum count is reached the counter 110 supplied a clock pulse to the count input of the counter 111, which is employed as seconds counter. After its maximum count 59 is reached the counter 111 supplies a clock pulse to the count input of the counter 112, which serves as minutes counter. The counts of the counters 110, 111 and 112 are applied to a circuit 116 via the parallel outputs of the counters and via the buses 113, 114 and 115 respectively to derive the fourteen parity bits for the purpose of error detection in a customary manner.

The modulation circuit 103 further comprises a 42-bit shift register 117 divided into five successive sections 117a, ... 117e. A bit combination "1001" is applied to the four parallel inputs of the 4-bit section 117a, which bit combination is converted into the position synchronization signal 11 in a manner to be described hereinafter during the biphase mark modulation. The sections 117b, 117c and 117d each have a length of 8 bits and the section 117e has a length of 14 bits. The count of the counter 111 is applied to the parallel inputs of section 117b via the bus 115. The count of the counter 111 is applied to the parallel inputs of the section 117c via the bus 114. The count of the counter 110 is transferred to the parallel inputs of the section 117d via the bus 113. The fourteen parity bits generated by the circuit 116 are applied to parallel inputs of section 117b via a bus 116a.

The serial output signal of the shift register is fed to a biphase-mark modulator 118. The output of the modulator 118 is applied to an FM modulator 119. The circuit 103 further comprises a clock-generation circuit 120 for generating the control signals for the counter 118, the shift register 117, the biphase-mark modulator 118 and the FM modulator 119.

In the present example the radiation-sensitive layer 185 is scanned with a velocity corresponding to the nominal scanning velocity of EFM modulated signals, (1.2-1.4 m/s) during manufacture of the master disc. The clock-generation circuit 120 then generates a 75-Hz clock signal 139 for the counter 110, so that the counts of the counters 110, 111 and 112 constantly indicate the time elapsed during scanning of the layer 18S.

Immediately after adaptation of the counts of the counters 110, 111 and 112 the clock-generation circuit supplies a control signal 128 to the parallel load input of the shift register 117, causing the shift register to be loaded in conformity with the signals applied to the parallel inputs, namely the bit combination "1001", the counts of the counters 110, 111 and 112, and the parity bits.

The bit pattern loaded into the shift register 117 is applied to the biphase-mark modulator 118 via the serial output in synchronism with a clock signal 138 generated by the clock-generation circuit 120. The frequency of this clock signal 138 is 3150 Hz, so that the entire shift register is empty at the very instant at which it is re-loaded via the parallel inputs.

The biphase-mark modulator 118 converts the 42 bits from the shift register into the 84 channel bits of the position-code signal. For this purpose the modulator 118 comprises a clocked flip-flop 121 whose output logic level changes in response to a clock pulse on the clock input. By means of a gate circuit, the clock signals 122 are derived from the signals 123, 121, 125 and 126 generated by the clock-generation circuit 120 and from the serial output signal 127 of the shift register 170 The output signal 127 is applied to an input of a two-input AND gate 129. The signal 123 is applied to the other input of the AND gate 129. The output signal of the AND gate 129 is applied to the clock input of the flip-flop 121 via an OR gate 130. The signals 125 and 126 are applied to the inputs of the OR gate 131, whose output is connected to one of the inputs of a two-input AND gate 132. The output signal of the AND gate 132 is also applied to the clock input of the flip-flop 121 via the OR-gate 130.

Figure 10:
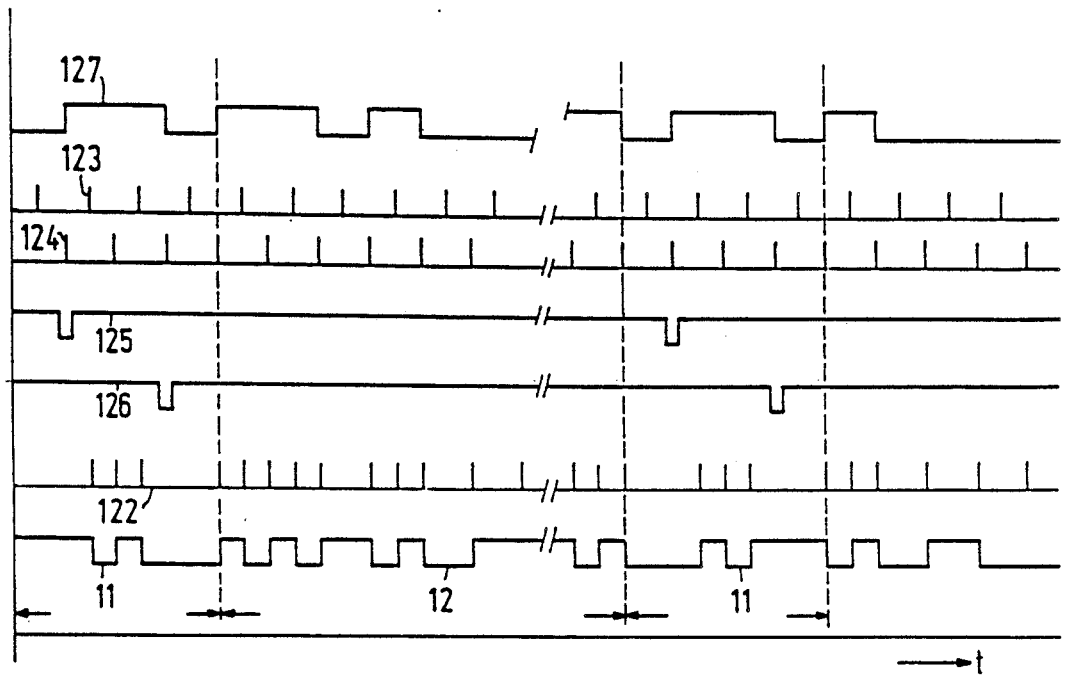

The signals 123 and 124 are two 180° phase-shifted pulse-shaped signals (see FIG. 10) of a frequency equal to the bit rate of the signal 127 (=3150 HZ) from the shift register 117. The signals 125 and 126 are negative pulses having a repetition rate of 75 Hz.

The phase of the signal 125 is such that the negative pulse of the signal 125 coincides with the second pulse of the signal 124 after reloading of the shift register 117. The negative pulse of the signal 126 coincides with the fourth pulse of the signal 124 after reloading of the shift register 117.

The biphase-mark-modulated position-code signal 12 on the output of the flip-flop 121 is generated as follows. The pulses of the signal 124 are transferred to the clock input of the flip-flop 121 via the AND gate 132 and the OR gate 130, so that the logic value of the position-code signal 12 changes in response to every pulse of the signal 124. Moreover, if the logic value of the signal 127 is "1" the pulse of the signal 123 is transferred to the clock input of the flip-flop 121 via the AND gates 129 and 130, so that for every "1" bit an additional change of the logic signal value is obtained. In principle, the synchronization signals are generated in a similar way. However, the application of the negative pulses of the signals 125 and 126 prevents the second and the fourth pulse of the signal 124 after reloading of the shift register from being transferred to the flip-flop 121, yielding a position-synchronization signal which can be distinguished from a biphase-mark-modulated signal. It is to be noted that this modulation method may lead to two different synchronization signals which are inverted relative to one another.

The position-information signal thus obtained on the output of the flip flop 121 is applied to the FM modulator 119, which is 35 suitably of a type with a fixed relationship between the frequencies generated on the output of the FM modulator and the bit rate of the position-information signal. When the scanning velocity control is not disturbed the subcode-synchronization signals in the EFM signal remain in synchronism with the position-synchronization signals 11 in the track 4 during recording of an EFM signal by means of apparatus 50. Disturbances in the velocity control resulting from imperfections of the record carrier can be compensated for by very small corrections, as already described with reference to FIG. 4.

In the FM modulator 119 shown in FIG. 9 an advantageous relationship between the output frequencies and the bit rates of the position-information signal is obtained. The FM modulator 119 comprises a frequency divider 137 having a divisor "8". Depending on the logic value of the position-information signal a clock signal 134 having a frequency of $(27) \cdot (6300)$ Hz or a clock signal 135 having a frequency of $(29) \cdot (6300)$ Hz is applied to the frequency divider 137. For this purpose the FM modulator 119 comprises a conventional multiplex circuit 136 depending on the logic value of the position-information signal the frequency on the output 133 of the FM modulator is $$\frac{29}{8} \cdot 6300 = 22{,}8375 \text{ Hz or } \frac{27}{8} \cdot 6300 = 21{,}2625 \text{ Hz.}$$

Since the frequency of the signals 134 and 135 are integral multiples of the channel-bit rate of the position-information signal the length of one channel bit corresponds to an integral number of periods of the clock signals 134 and 135 which means that the phase steps in FM modulation are minimal.

Moreover, it is to be noted that on account of the d.c. component of the position-information signal the average frequency of the FM-modulated signal is exactly equal to the 22.05 kHz, which means that the velocity control is influenced to a negligible extent by the FM modulation.

Moreover, it is to be noted that for the FM modulator other FM modulators can be used than the modulator 119 shown in FIG. 9, for example a conventional CPFSK modulator (CPFSK=Continuous Phase Frequency Shift Keying). Such CPFSK modulators are described inter alia in A. Bruce Carlson: "Communication Systems", McGraw Hill, page 519 ff.

Moreover, it is preferred to utilize an FM modulator with a sinusoidal output signal. With the FM modulator 119 shown in FIG. 9 this can be achieved, for example, by arranging a band-pass filter between the output of the divider 117 and the output of the modulator 119. Further, it is to be noted that the frequency swing is suitably of the order of magnitude of 1 kHz.

Finally, it is to be noted that the scope of the invention is not limited to the illustrative embodiments described herein. For example, in the embodiments described the frequency spectrum of the position-information signal exhibits substantially no overlap with the frequency spectrum of the signal to be recorded. However, the position-information signal recorded by means of the preformed track modulation can, in that case, always be distinguished from the subsequently recorded information signal. In the case of magneto-optical recording, the frequency spectra of the prerecorded position-information signal and the subsequently recorded information signal may overlap one another. Indeed, during scanning with a radiation beam the track modulation results in an intensity modulation of the radiation beam, whilst the information pattern formed by magnetic domains modulates the direction of polarization (Kerr-effect) of the reflected radiation beam independently of the intensity modulation. In the embodiments described in the foregoing, the scanning beam is modulated depending on the information to be recorded. In the case of recording on magneto-optical record carriers, it is also possible to modulate the magnetic field instead of the scanning beam.

What is claimed is:

1. An optically readable and inscribable record carrier comprising: a recording layer for recording an information pattern of optically detectable recording marks, the record carrier having a servo track wherein a portion for information recording includes a periodic track modulation different from the information pattern, the periodic track modulation having a modulation frequency indicative of a position-information signal comprising position-code signals alternating with position-synchronization signals.

2. An optically readable inscribable record carrier as claimed in claim 1, characterized in that the position-code signals are biphase-mark-modulated signals and the position-synchronization signals have signal waveforms different from the biphase-mark-modulated signal.

3. A record carrier as claimed in any one of the preceding claims, characterized in that the servo track has a width that is between $0.4 \times 10^{-6}$ meters and $1.25 \times 10^{-6}$ meters, and the periodic track modulation being a track wobble having an amplitude which is substantially equal to $30 \times 10^{-9}$ meters.

4. A record carrier as in either claim 1 or claim 2, characterized in that the periodic tack modulation has a period between $54 \times 10^{-6}$ meters, and $64 \times 10^{-6}$ meters and a distance between starting positions of the track portions includes the position-synchronization signal corresponding to 294 times an average of the period of the track modulation.

5. A record carrier as claimed in any of the claims 1 or 2, characterized in that the position-code signal is indicative of elapsed time at a nominal scanning velocity to cover a distance between a beginning of the track and a position where the track provides track modulation corresponding to the position where the track provides track modulation corresponding to the position-code signal.

6. A record carrier as claimed in claim 5, characterized in that the position-code signal is modulated in conformity with a position-information code which comprises at least a portion similar to an absolute-time code contained in an EFM-modulated signal in conformity with the CD-standard.

7. An apparatus for manufacturing a record carrier as claimed in any one of claims 1 or 2, comprising and optical system for scanning a radiation-sensitive layer of a carrier along a path corresponding to the servo track to be formed and a deflection device for deflecting the radiation beam in such a way that the position of incidence of the beam on the radiation-sensitive layer is deflected in a direction perpendicular to the scanning direction corresponding to a control signal applied to the deflection device, characterized in that the apparatus comprises a signal generator for generating a periodic signal as the control signal and the control signal having a frequency that is modulated by the position-information signal.

8. An apparatus as claimed in claim 7, characterized in that the signal generator comprises a modulator for converting a position-information code into the position-information signal and an FM modulator for modulating the frequency of the control signal in conformity with the position-information signal.

9. An apparatus as claimed in claim 8, characterized in that the modulator comprises a biphase-mark modulator and means for generating synchronization signals of a signal waveform differing from a biphase-mark-modulated signal.

10. An apparatus as claimed in claim 8, characterized in that the apparatus comprises means for generating a position-information information code indicating elapsed time at a nominal scanning velocity of the record carrier to cover the distance between a starting position of a servo track and the position where the position-information code is recorded as a track modulation.

11. An apparatus as claimed in claim 10, characterized in that the apparatus comprises means for generating a position-information code similar to the absolute-time code contained in an EFM-modulated signal in conformity with the CD-standard.

12. An apparatus as claimed in claim 7 characterized in that the apparatus comprises means for maintaining a ratio between a scanning velocity of the radiation sensitive layer and an average frequency of the control signal, the average frequency having a period between $54 \times 10^{-6}$ meters and $64 \times 10^{-6}$ meters, and the signal generator generating position-synchronization signals of a frequency equal to 294 times the average frequency of the control signal.

13. An apparatus as claimed in claim 7 characterized in that the signal generator produces a control signal having an amplitude of a value for which the excursion of the position of incidence on the radiation-sensitive, which excursion corresponds to the control signal, has an amplitude of substantially $30.10^{-9}$ meters.

14. An apparatus for recording information on a record carrier as claimed in any one of the claims 1 or 2, the apparatus comprising write means for forming a pattern of recording marks indicative of information in the servo track, the write means including scanning means for scanning the servo track with a radiation beam, the radiation beam reflected or transmitted by the record carrier being modulated by the track modulation, a detector for detecting the reflected or transmitted radiation beam, and a circuit for deriving a clock signal of a frequency dictated by the track modulation from the radiation detected by the detector, the recording apparatus comprising and RM demodulator for recovering the position-information signal from the clock signal and means for separating the position-code signals and the synchronization-signals.

15. An apparatus as claimed in claim 14, characterized in that the apparatus comprises a biphase mark demodulator for recovering the position codes from the position-code signals.

16. An apparatus for reading a record carrier as claimed in any one of the claims 1 or 2, on which record carrier an information signal is recorded as a pattern of recording marks in the servo track, the apparatus comprising a scanning device for scanning the servo track with substantially constant velocity by a radiation beam, the radiation beam reflected or transmitted by the record carrier being modulated by the track modulation and the pattern of recording marks, a detector for detecting the reflected or transmitted radiation beam, a circuit for deriving an information signal representing the recorded information from the radiation beam detected by the detector, and a circuit for deriving a clock signal whose frequency is determined by the track modulation from the radiation beam detected by the detector, and the apparatus comprises an FM demodulation circuit for recovering the position-information signal from the clock signal and means for separating the position-code signals and the synchronization signals.

17. An apparatus as claimed in claim 16, characterized in that the apparatus comprises a biphase-mark demodulator for recovering the position code from the position-code signals.

* * * * *